(12) United States Patent
Lee et al.

(10) Patent No.: US 11,637,065 B2
(45) Date of Patent: Apr. 25, 2023

(54) SEMICONDUCTOR DEVICE INCLUDING VIA AND WIRING

(71) Applicant: Samsung Electronics Co., Ltd., Suwon-si (KR)

(72) Inventors: Miji Lee, Seoul (KR); Taeyoung Jeong, Hwaseong-si (KR); Yoonkyeong Jo, Seoul (KR); Sangwoo Pae, Suwon-si (KR); Hwasung Rhee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/648,829

(22) Filed: Jan. 25, 2022

(65) Prior Publication Data

US 2022/0148965 A1 May 12, 2022

Related U.S. Application Data

(63) Continuation of application No. 16/877,945, filed on May 19, 2020, now Pat. No. 11,239,162.

(30) Foreign Application Priority Data

Aug. 8, 2019 (KR) .................. 10-2019-0096700

(51) Int. Cl.
*H01L 23/528* (2006.01)
*H01L 23/522* (2006.01)
*H01L 21/768* (2006.01)
*H01L 23/532* (2006.01)
(Continued)

(52) U.S. Cl.
CPC ........ *H01L 23/528* (2013.01); *H01L 21/7684* (2013.01); *H01L 21/76807* (2013.01); *H01L 21/76843* (2013.01); *H01L 21/76877* (2013.01); *H01L 23/5226* (2013.01);
(Continued)

(58) Field of Classification Search
CPC ............. H01L 23/528; H01L 21/76807; H01L 21/7684; H01L 21/76843; H01L 21/76877; H01L 23/5226; H01L 23/5283; H01L 23/53295; H01L 29/41791; H01L 29/7851
See application file for complete search history.

(56) References Cited

U.S. PATENT DOCUMENTS 6,309,957 B1 10/2001 Tu et al.
7,071,099 B1 7/2006 Greco et al.
(Continued)

*Primary Examiner* — Earl N Taylor
(74) *Attorney, Agent, or Firm* — Myers Bigel, P.A.

(57) ABSTRACT

A semiconductor device includes a lower wiring, an upper wiring on the lower wiring, and a via between the lower wiring and the upper wiring. The lower wiring has a first end surface and a second end surface opposing each other, the upper wiring has a third end surface and a fourth end surface opposing each other, and the via has a first side adjacent to the second end surface of the lower wiring and a second side adjacent to the third end surface of the upper wiring. A distance between a lower end of the first side of the via and an upper end of the second end surface of the lower wiring is less than ⅓ of a width of a top surface of the via, and a distance between an upper end of the second side of the via and an upper end of the third end surface of the upper wiring is less than ⅓ of the width of the top surface of the via.

20 Claims, 15 Drawing Sheets

(51) Int. Cl.
*H01L 29/417* (2006.01)
*H01L 29/78* (2006.01)

(52) U.S. Cl.
CPC .... *H01L 23/5283* (2013.01); *H01L 23/53295* (2013.01); *H01L 29/41791* (2013.01); *H01L 29/7851* (2013.01)

(56) References Cited

U.S. PATENT DOCUMENTS

| | | | |
|---|---|---|---|
| 8,404,584 B2 * | 3/2013 | Imada | H01L 21/76807 |
| | | | 257/70 |
| 8,614,143 B2 * | 12/2013 | Kulkarni | H01L 23/528 |
| | | | 438/618 |
| 8,803,292 B2 | 8/2014 | Chen et al. | |
| 9,583,438 B2 | 2/2017 | Liaw et al. | |
| 9,685,404 B2 * | 6/2017 | Bao | H01L 21/76805 |
| 9,754,822 B1 | 9/2017 | Chou et al. | |
| 10,727,178 B2 * | 7/2020 | Chang | H01L 21/31116 |
| 11,342,222 B2 * | 5/2022 | Hsueh | H01L 21/76849 |
| 2004/0127016 A1 | 7/2004 | Hoog et al. | |
| 2007/0232075 A1 * | 10/2007 | Imada | H01L 21/02282 |
| | | | 438/758 |
| 2009/0085170 A1 * | 4/2009 | Imada | H01L 21/76831 |
| | | | 257/E21.24 |
| 2009/0166868 A1 * | 7/2009 | Lee | H01L 23/5226 |
| | | | 257/734 |
| 2009/0170305 A1 | 7/2009 | West et al. | |
| 2010/0136781 A1 * | 6/2010 | Kulkarni | H01L 23/528 |
| | | | 257/E21.585 |
| 2013/0176073 A1 * | 7/2013 | Bao | H01L 23/5256 |
| | | | 257/E23.149 |
| 2017/0250104 A1 * | 8/2017 | Singh | H01L 23/5226 |
| 2018/0366463 A1 * | 12/2018 | Cho | H01L 27/11529 |
| 2020/0105664 A1 * | 4/2020 | Han | H01L 21/76829 |
| 2020/0395294 A1 * | 12/2020 | Liang | H01L 21/76813 |
| 2021/0043556 A1 * | 2/2021 | Lee | H01L 21/76843 |
| 2022/0148965 A1 * | 5/2022 | Lee | H01L 23/53295 |

\* cited by examiner

'A'

'Ba'

SEMICONDUCTOR DEVICE INCLUDING VIA AND WIRING

CROSS-REFERENCE TO RELATED APPLICATION(S)

This application is a continuation of U.S. application Ser. No. 16/877,945, filed May 19, 2020, which claims the benefit under 35 USC 119(a) of Korean Patent Application No. 10-2019-0096700 filed on Aug. 8, 2019 in the Korean Intellectual Property Office, the entire disclosure of which is incorporated herein by reference.

BACKGROUND

The present inventive concept relates to semiconductor devices, and, more particularly, to semiconductor devices including a via and wiring and methods of forming the same.

As demand for high performance, high speed, and/or multifunctionality of semiconductor devices increases, the degree of integration of semiconductor devices may also increase. In accordance with the trend for higher integration of semiconductor devices, the size of transistors has generally been reduced. As a result, the size of wires electrically connected to transistors having a reduced size may also be reduced.

SUMMARY

An aspect of the present inventive concept is to provide a semiconductor device having increased integration.

An aspect of the present inventive concept is to provide a semiconductor device having improved reliability.

According to some embodiments of the present inventive concept, a semiconductor device includes a lower structure, a first structure on the lower structure, and a second structure on the first structure. The lower structure includes a source/drain region and a gate electrode on a semiconductor substrate, an insulating layer on the source/drain region and the gate electrode, and a contact plug electrically connected to one of the source/drain region and the gate electrode while penetrating through the insulating layer. The first structure includes a first via electrically connected to the contact plug, a first wiring electrically connected to the first via, and a first insulating structure bordering sides of the first via and sides of the the first wiring. The first insulating structure includes a first lower etch-stop layer, a first lower insulating layer on the first lower etch-stop layer, a first upper etch-stop layer on the first lower insulating layer, and a first upper insulating layer on the first upper etch-stop layer. The first lower etch-stop layer and the first lower insulating layer border the sides of the first via. The first upper etch-stop layer and the first upper insulating layer border the sides of the first wiring. The first wiring has a first end surface and a second end surface opposing each other. The first via has a first side adjacent to the first end surface of the first wiring and a second side opposing the first side. The second structure includes a second via, a second wiring disposed on the second via and electrically connected to the second via, and a second insulating structure bordering sides of the second via and the second wiring. The second insulating structure includes a second etch-stop layer and a second insulating layer on the second etch-stop layer. The second insulating layer borders the sides of the second wiring and extends onto the sides of the second via. The second wiring has a third end surface and a fourth end surface opposing each other. The third end surface of the second wiring is closer to the second via than the fourth end surface of the second wiring. The second via has a third side adjacent to the second end surface of the first wiring and a fourth side adjacent to the third end surface of the second wiring. A distance between an upper end of the first side of the first via and a lower end of the first end surface of the first wiring is less than a distance between the third end surface of the second wiring and the fourth side of the second via.

According to some embodiments of the present inventive concept, a semiconductor device includes a first via on a semiconductor substrate, a first wiring disposed on the first via and electrically connected to the first via, a second via disposed on the first wiring and electrically connected to the first wiring, a second wiring disposed on the second via and electrically connected to the second via, a third via disposed on the second wiring and electrically connected to the second wiring, and a third wiring disposed on the third via and electrically connected to the third via. The first wiring has a first end surface and a second end surface opposing each other. The second wiring has a third end surface and a fourth end surface opposing each other. The third wiring has a fifth end surface and a sixth end surface opposing each other. The first via has a first side adjacent to the first end surface, and a second side opposing the first side. The second via has a third side adjacent to the second end surface of the first wiring and a fourth side adjacent to the third end surface of the second wiring. The third via has a fifth side adjacent to the fourth end surface of the second wiring and a sixth side adjacent to the fifth end surface of the third wiring. A distance between an upper end of the first side of the first via and a lower end of the first end surface of the first wiring is less than a distance between an upper end of the fourth end surface of the second wiring and a lower end of the fifth side of the third via.

According to some embodiments of the present inventive concept, a semiconductor device includes a lower wiring on a semiconductor substrate, an upper wiring on the lower wiring, and a via between the lower wiring and the upper wiring. The lower wiring has a first end surface and a second end surface opposing each other. The upper wiring has a third end surface and a fourth end surface opposing each other. The via has a first side adjacent to the second end surface of the lower wiring and a second side adjacent to the third end surface of the upper wiring. A distance between a lower end of the first side of the via and an upper end of the second end surface of the lower wiring is less than ⅓ of a width of a top surface of the via. A distance between an upper end of the second side of the via and an upper end of the third end surface of the upper wiring is less than ⅓ of the width of the top surface of the via.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
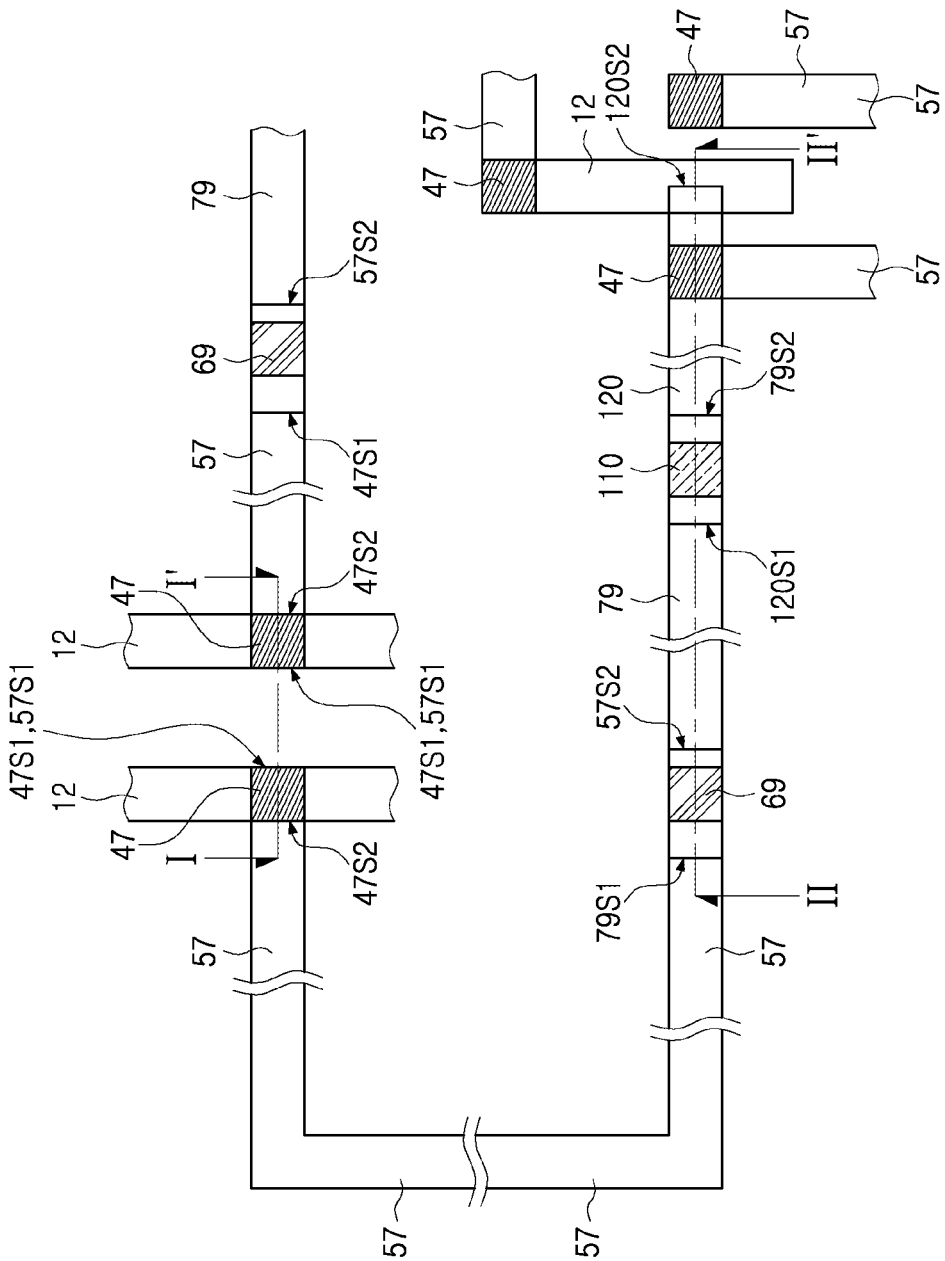
FIG. 1 is a plan view illustrating a portion of components of a semiconductor device according to example embodiments of the inventive concept.

Example embodiments of the inventive concepts will now be described more fully with reference to the accompanying drawings, in which example embodiments are shown. The same reference numerals or the same reference designators may denote the same elements or components throughout the specification.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

In the following, the terms such as "first," "second," "third," and the like may be used to describe various components, but the components are not limited by the terms. The terms are used only for distinguishing one component from another. For example, a "first component" may be referred to as a "second component" without departing from the scope of the present inventive concept.

Figure 2:
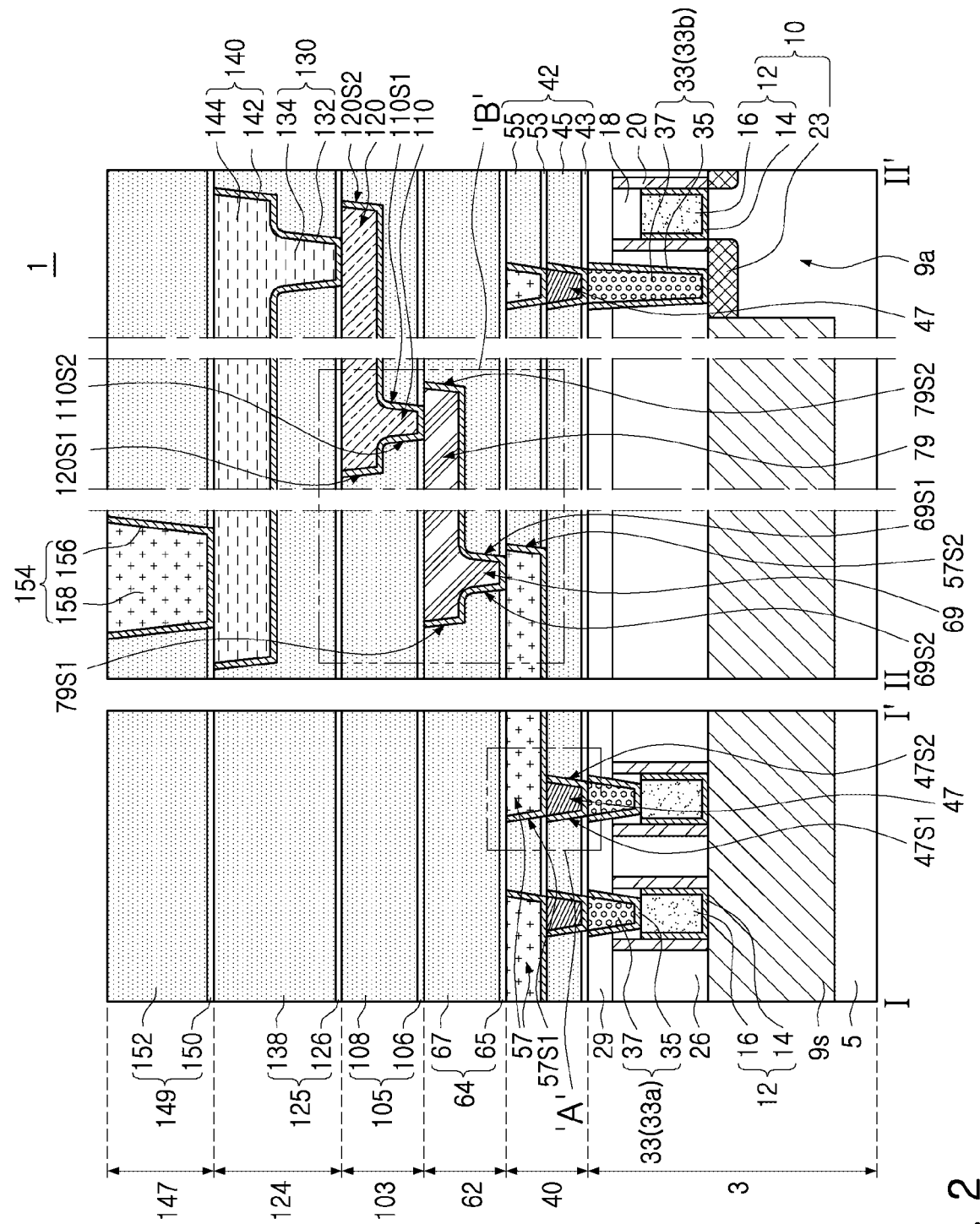
FIG. 2 is a cross-sectional view illustrating a semiconductor device according to an example embodiment of the inventive concept.
Figure 3A:
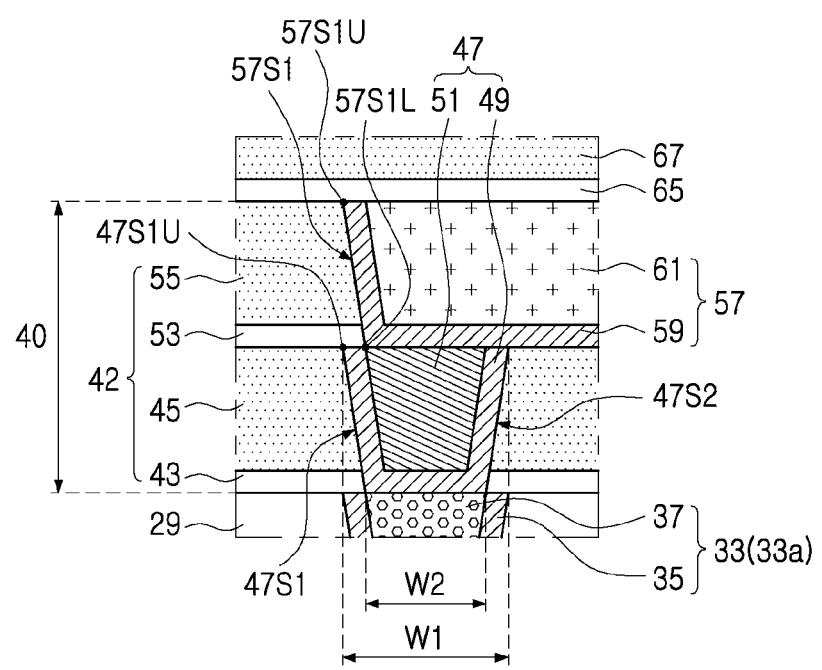
FIG. 3A is an enlarged view illustrating a portion "A" of FIG. 2.
Figure 3B:
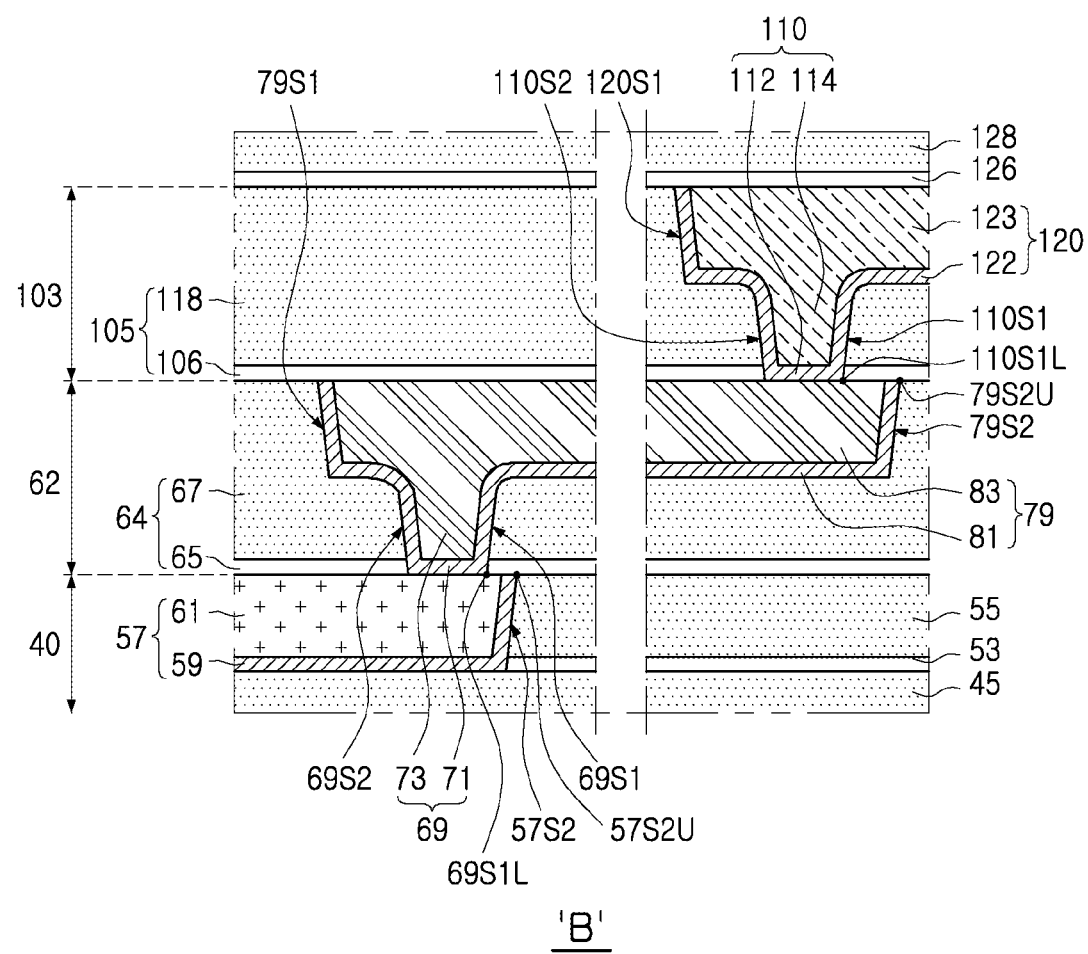
FIG. 3B is an enlarged view illustrating a portion "B" of FIG. 2.

First, a semiconductor device according to an example embodiment of the inventive concept will be described with reference to FIGS. 1, 2, 3A, and 3B. FIG. 1 is a plan view illustrating components of a semiconductor device according to an example embodiment of the inventive concept, FIG. 2 is a cross-sectional view illustrating a region taken along lines I-I' and II-II' of FIG. 1, FIG. 3A is an enlarged view of a portion represented by "A" of FIG. 2, and FIG. 3B is an enlarged view of a portion represented by "B" of FIG. 2.

Referring to FIGS. 1, 2, 3A, and 3B, a semiconductor device 1 according to an example embodiment of the inventive concept may include a lower structure 3, a first structure 40 on the lower structure 3, a second structure 62 on the first structure 40, and a third structure 103 on the second structure 62.

The lower structure 3 may include a semiconductor substrate 5 and an isolation region 9s defining an active region 9a on the semiconductor substrate 5. The isolation region 9s may be a shallow trench isolation region. The lower structure 3 may further include a gate structure (12, 18, 20) overlapping the active region 9a in a direction parallel to a direction in which the lower structure 3, first structure 40, second structure 62, and third structure 103 are stacked and extending over the isolation region 9s, and a source/drain region 23 disposed in the active region 9a next to the gate structure (12, 18, 20). The gate structure (12, 18, 20) may include a gate 12 and an insulating capping layer 18 stacked sequentially, and an insulating spacer 20 on the sides of the gate 12 and the insulating capping layer 18. The gate 12 may include a gate electrode 16 and a gate dielectric 14 on and at least partially covering side and bottom surfaces of the gate electrode 16. Thus, a transistor 10 including the source/drain region 23 and the gate 12 may be provided. The transistor 10 may be a three-dimensional transistor, such as a FinFET, but embodiments of the transistor 10 are not limited thereto. For example, the transistor 10 may be a transistor including a nanowire, or may be a transistor including a nano sheet, for example, a multi bridge channel FET (MBCFET®).

The lower structure 3 may further include interlayer insulating layers 26 and 29 on and at least partially covering the gate structure (12, 18, 20). The interlayer insulating layers (26 and 29) may include a first interlayer insulating layer 26 on the isolation region 9s and the active region 9a, and a second interlayer insulating layer 29 on the first interlayer insulating layer 26. In an example, the second interlayer insulating layer 29 may be on and at least partially cover an upper portion of the insulating capping layer 18.

The lower structure 3 may further include contact plugs 33. Each of the contact plugs 33 may include a plug pattern 37 and a barrier layer 35 on and at least partially covering side and bottom surfaces of the plug pattern 37.

Any one of the contact plugs 33 penetrates through an insulating layer on and at least partially covering the source/drain region 23 and the gate electrode 16, and may be electrically connected to one of the source/drain region 23 and the gate electrode 16. For example, the contact plugs 33 may include a gate contact plug 33a penetrating through the second interlayer insulating layer 29 and the insulating capping layer 18 and electrically connected to the gate electrode 16, and a source/drain contact plug 33b penetrating through the first and second interlayer insulating layers 26 and 29 and electrically connected to the source/drain region 23.

The first structure 40 may include a first via 47, a first wiring 57 electrically connected to the first via 47, and a first insulating structure 42 bordering or surrounding side surfaces of the first via 47 and the first wiring 57.

The first via 47 may include a first via gapfill pattern 51 and a first via barrier layer 49 on and at least partially covering side and bottom surfaces of the first via gapfill pattern 51. The first wiring 57 may include a first wiring gapfill pattern 61 and a first wiring barrier layer 59 on and at least partially covering side and bottom surfaces of the first wiring gapfill pattern 61. The first wiring barrier layer 59 may have a portion interposed between the first wiring gapfill pattern 61 and the first via gapfill pattern 51.

In an example, each of the first via barrier layer 49 and the first wiring barrier layer 59 may comprise one or more materials including, but not limited to, titanium (Ti), tantalum (Ta), cobalt (Co), TiN and/or TaN, but example embodiments thereof are not limited to these kinds of materials and these materials may be supplemented and/or replaced with other conductive materials. In an example, each of the first via gapfill pattern 51 and the first wiring gapfill pattern 61 may comprise one or more materials including, but not limited to, aluminum (Al), copper (Cu) and/or tungsten (W), but example embodiments thereof are not limited to these materials and may be supplemented and/or replaced with other conductive materials.

The first insulating structure 42 may include a first lower etch-stop layer 43, a first lower insulating layer 45 on the first lower etch-stop layer 43, a first upper etch-stop layer 53 on the first lower insulating layer 45, and a first upper insulating layer 55 on the first upper etch-stop layer 53.

The first lower etch-stop layer 43 and the first lower insulating layer 45 may border or surround a side of the first via 47. The first upper etch-stop layer 53 and the first upper insulating layer 55 may border or surround a side of the first wiring 57.

In an example, the first lower etch-stop layer 43 and the first upper etch-stop layer 53 may be formed of a high-k dielectric material. The high-k dielectric material may include silicon nitride and/or aluminum oxide.

In an example, the first lower insulating layer 45 and the first upper insulating layer 55 may be formed of silicon oxide and/or a low-k dielectric material. The low-k dielectric material may include a SiOC material.

The first wiring 57 may have a first end surface 57S1 and a second end surface 57S2 opposing each other, and the first via 47 may have a first side surface 47S1 adjacent to the first end surface 57S1 of the first wiring 57, and a second side surface 47S2 opposing the first side surface 47S1.

In an example, a length of the first wiring 57 may be about 50 times or less than a width of the first via 47. In an example, the length of the first wiring 57 may be about 40 times or less than the width of the first via 47.

In an example, the length of the first wiring 57 may be a length measured along a distance between the first end surface 57S1 and the second end surface 57S2, and the width of the first via 47 may be a distance between the first side surface 47S1 and the second side surface 47S2.

In an example, in the case of the first via 47, a width W1 of a lower surface may be less than a width W2 of a top surface. Thus, the first and second side surfaces 47S1 and 47S2 of the first via 47 may be inclined. In the case of the first wiring 57, the first and second end surfaces 57S1 and 57S2 may be inclined. For example, in the first wiring 57, a top surface and the first end surface 57S1 of the first wiring 57 may form an acute angle, and the top surface and the second end surface 57S2 of the first wiring 57 may form an acute angle. Therefore, in the first wiring 57, a top surface may have a greater width in the horizontal direction as viewed in the cross-sectional diagram of FIG. 2 than a width of the lower surface. The length of the top surface of the first wiring 57 may be about 50 times or less than the width of the top surface of the first via 47.

In an example, the first side surface 47S1 of the first via 47 and the first end surface 57S1 of the first wiring 57 may overlap in a vertical direction, i.e., in a direction parallel to a direction in which the lower structure 3, first structure 40, second structure 62, and third structure 103 are stacked. The vertical direction may also be viewed as a direction perpendicular to the top surface of the first wiring 57.

The second structure 62 may include a second via 69, a second wiring 79 disposed on the second via 69 and electrically connected thereto, and a second insulating structure 64 bordering or surrounding side surfaces of the second via 69 and the second wiring 79.

A lower surface of the second via 69 may physically contact a portion of a top surface of the first wiring 57. The second via 69 may include a second via gapfill pattern 73 and a second via barrier layer 71 on and at least partially covering lower and side surfaces of the second via gapfill pattern 73.

The second wiring 79 may extend continuously from the second via 69 without an interface. The second wiring 79 may include a second wiring gapfill pattern 83 continuously extending from the via gapfill pattern 73 without an interface, and a second wiring barrier layer 81 continuously extending from the second via barrier layer 71 without an interface and extending on a lower surface and a side surface of the second wiring gapfill pattern 83.

The second via barrier layer 71 and the second wiring barrier layer 81 may be integrally formed. That is, the second via barrier layer 71 and the second wiring barrier layer 81 may comprise a monolithic layer. The second via barrier layer 71 and the second wiring barrier layer 81 may comprise one more materials including, but not limited to, Ti, Ta, Co, TiN and/or TaN, but example embodiments thereof are not limited to such material types, and may be supplemented and/or replaced by other conductive materials.

The second via gapfill pattern 73 and the second wiring gapfill pattern 83 may be integrally formed. That is, the second gapfill pattern 73 and the second gapfill pattern 83 may comprise a monolithic layer. The second via gapfill pattern 73 and the second wiring gapfill pattern 83 may comprise one or more materials including, but not limited to, Al, Cu, and/or W, but example embodiments thereof are not limited to such material types, and may be supplemented and/or replaced by other conductive materials.

The second insulating structure 64 may include a second lower etch-stop layer 65 and a second lower insulating layer 67 on the second lower etch-stop layer 65. The second lower etch-stop layer 65 may be spaced apart from the second wiring 79. The second lower etch-stop layer 65 may be formed of a high-k dielectric material, and the second lower insulating layer 67 may be comprise silicon oxide and/or a low-k dielectric material.

The second wiring 79 may have a third end surface 79S1 and a fourth end surface 79S2 opposing each other. The second via 69 may have a third side surface 69S1 adjacent to the fourth end surface 79S2 of the second wiring 79, and a fourth side surface 69S2 adjacent to the third end surface 79S1 of the second wiring 79.

The third structure 103 may include a third via 110, a third wiring 120 disposed on the third via 110 and electrically connected to the third via 110, and a third insulating structure 105 bordering or surrounding side surfaces of the third via 110 and the third wiring 120. The third insulating structure 105 may include a third etch-stop layer 106 and a third insulating layer 108 on the third etch-stop layer 106.

In an example, the third etch-stop layer 106 may comprise a high-k dielectric material, and the third insulating layer 108 may comprise silicon oxide and/or a low-k dielectric material.

The lower surface of the third via 110 may physically contact a portion of a top surface of the second wiring 79. The third via 110 may include a third via gapfill pattern 114 and a third via barrier layer 112 on and at least partially covering lower and side surfaces of the third via gapfill pattern 114.

The third wiring 120 may extend continuously from the third via 110 without an interface. The third wiring 120 may include a third wiring gapfill pattern 123 continuously extending from the via gapfill pattern 114 without an interface, and a third wiring barrier layer 122 that extends continuously from the third via barrier layer 112 without an interface and extends onto bottom and side surfaces of the third wiring gapfill pattern 123.

The third via barrier layer 112 and the third wiring barrier layer 122 may be integrally formed. That is, the third via barrier layer 112 and the third wiring barrier layer 122 may comprise a monolithic layer. The third via barrier layer 112 and the third wiring barrier layer 122 may comprise one or more materials including, but not limited to Ti, Ta, Co, TiN and/or TaN, but example embodiments thereof are limited to such material types, and may be supplemented and/or replaced by other conductive materials.

The third via gapfill pattern 114 and the third wiring gapfill pattern 123 may be integrally formed. That is, the third via gapfill pattern 114 and the third wiring gapfill pattern 123 may comprise a monolithic layer. The third via gapfill pattern 114 and the third wiring gapfill pattern 123 may comprise one or more materials including, but not limited to, Al, Cu and/or W, but example embodiments thereof are not limited to such material types, and may also be supplemented and/or replaced with other conductive materials.

The third wiring 120 may have a fifth end surface 120S1 and a sixth end surface 120S2 opposing each other. The third via 110 may include a fifth side surface 110S1 adjacent to the fourth end surface 79S2 of the second wiring 79, and a sixth side surface 110S2 adjacent to the fifth end surface 120S1 of the third wiring 120.

In example embodiments, the first via 47 may be formed in a single damascene structure, and the first wiring 57 may be formed in a single damascene structure, and, thus, the size of the first via 47 and the first wiring 57 may be significantly reduced. Thus, the integration degree of a semiconductor device may be improved.

In example embodiments, a distance between an upper end 47S1U of the first side surface 47S1 of the first via 47 and a lower end 57S1L of the first end surface 57S1 of the first wiring 57 may be less than or equal to ⅓ of a width W1 of a top surface of the first via 47, or may be "0." Because the distance between the upper end 47S1U of the first side surface 47S1 of the first via 47 and the lower end 57S1L of the first end surface 57S1 of the first wiring 57 may be significantly reduced, the degree of integration of the semiconductor device may be improved.

Because the length of the first wiring 57 may be formed to be about 50 times or less than the width W1 of the top surface of the first via 47, the disconnection between the first wiring 57 and the first via 47 due to electromigration that may occur between the first wiring 57 and the first via 47 may be mitigated or prevented. Therefore, the reliability of the semiconductor device 1 may be improved.

In an example, the distance between the upper end 47S1U of the first side surface 47S1 of the first via 47 and the lower end 57S1L of the first end surface 57S1 of the first wiring 57 in the cross-sectional view of FIG. 3A may be less than a distance between an upper end 57S2U of the second end surface 57S2 of the first wiring 57 and a lower end 69S1L of the third side surface 69S1 of the second via 69.

In an example, the distance between the upper end 47S1U of the first side surface 47S1 of the first via 47 and the lower end 57S1L of the first end surface 57S1 of the first wiring 57 may be less than a distance between an upper end 79S2U of the fourth end surface 79S2 of the second wiring 79 and a lower end 110S1L of the fifth side surface 110S1 of the third via 110.

In an example, the distance between the upper end 57S2U of the second end surface 57S2 of the first wiring 57 and the lower end 69S1L of the third side surface 69S1 of the second via 69 in the cross-sectional view of FIG. 3B may be less than a distance between the upper end 79S2U of the fourth end surface 79S2 of the second wiring 79 and the lower end 110S1L of the fifth side surface 110S1 of the third via 110.

The semiconductor device 1 according to an example embodiment may further include a fourth structure 124 on the third structure 103 and a fifth structure 147 on the fourth structure 124.

The fourth structure 124 may include a fourth via 130, a fourth wiring 140 electrically connected to the fourth via 130 on the fourth via 130, and a fourth insulating structure 125 bordering or surrounding side surfaces of the fourth via 130 and the fourth wiring 140. The fourth insulating structure 125 may include a fourth etch-stop layer 126 and a fourth insulating layer 138 on the fourth etch-stop layer 126.

In an example, the fourth etch-stop layer 126 may comprise a high-k dielectric material, and the fourth insulating layer 138 may comprise silicon oxide and/or a low-k dielectric material.

A lower surface of the fourth via 130 may physically contact a portion of a top surface of the third wiring 120. The fourth via 130 may include a fourth via gapfill pattern 134 and a fourth via barrier layer 132 on and at least partially covering lower and side surfaces of the fourth via gapfill pattern 134.

The fourth wiring 140 may extend continuously from the fourth via 130 without a boundary surface. The fourth wiring 140 may include a fourth wiring gapfill pattern 144 extending continuously from the via gapfill pattern 134 without a boundary surface, and a fourth wiring barrier layer 142 extending continuously from the fourth via barrier layer 132 without a boundary surface and extending onto lower and side surfaces of the fourth wiring gapfill pattern 144. The fourth via barrier layer 132 and the fourth wiring barrier layer 142 may be integrally formed. That is, the fourth via barrier layer 132 and the fourth wiring barrier layer 142 may comprise a monolithic layer. The fourth via gapfill pattern 134 and the fourth wiring gapfill pattern 144 may be integrally formed. That is, the fourth via gapfill pattern 134 and the fourth wiring gapfill pattern 144 may comprise a monolithic layer.

In an example, the fourth via barrier layer 132 and the fourth wiring barrier layer 142 may comprise one or more materials including, but not limited to, titanium (Ti), tantalum (Ta), cobalt (Co), TiN, and/or TaN, but example embodiments thereof are not limited thereto. For example, the material of the fourth via barrier layer 132 and the fourth wiring barrier layer 142 may also be supplemented or replaced with another conductive material. The fourth via gapfill pattern 134 and the fourth wiring gapfill pattern 144 may comprise one or more materials including, but not limited to, (Al), copper (Cu), and/or tungsten (W), but example embodiments thereof are not limited to such material types and may be supplemented and/or replaced by other conductive materials.

The fifth structure 147 may include an upper conductive pattern 154 and a fifth insulating structure 149 bordering or surrounding a side surface of the upper conductive pattern 154. The fifth insulating structure 149 may include a fifth etch-stop layer 150 and a fifth insulating layer 152 on the fifth etch-stop layer 150. In an example, the fifth etch-stop layer 150 may comprise a high-k dielectric material, and the fifth insulating layer 152 may comprise silicon oxide and/or a low-k dielectric material. The upper conductive pattern 154 may include an upper gapfill pattern 158 and an upper barrier layer 156 on and at least partially covering lower and side surfaces of the upper gapfill pattern 158. The upper barrier layer 156 may comprise one or more materials including, but not limited to, Ti, Ta, Co, TiN, and/or TaN, but example embodiments thereof are not limited to these types of materials and may be supplemented and/or replaced with other conductive materials. The upper gapfill pattern 158 may comprise one or more materials including, but not limited to, Al, Cu, and/or W, but example embodiments thereof are not limited to these types of materials and may be supplemented and/or replaced with other conductive materials.

Figure 4A:
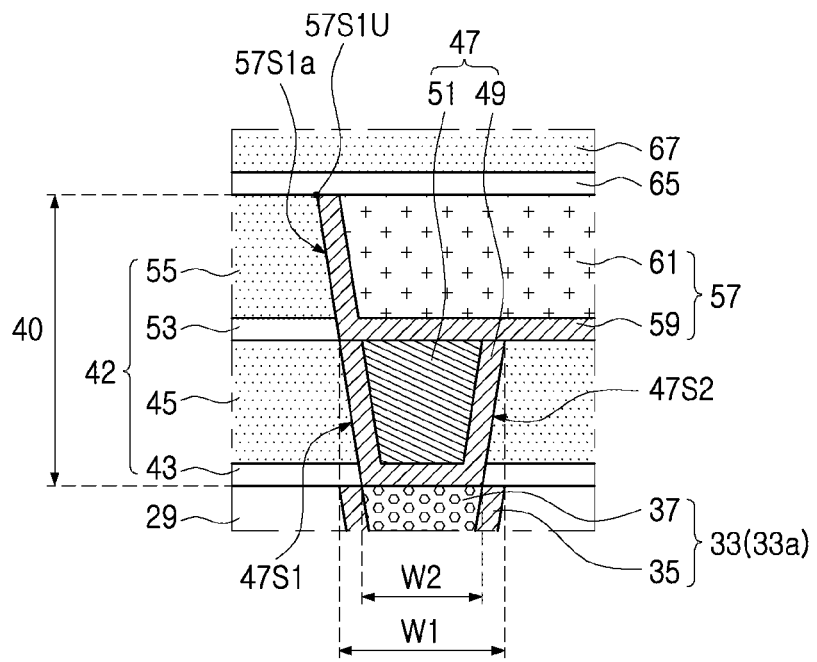
FIG. 4A is a partially enlarged view illustrating a modified example of a semiconductor device according to an example embodiment of the inventive concept.
Figure 4B:
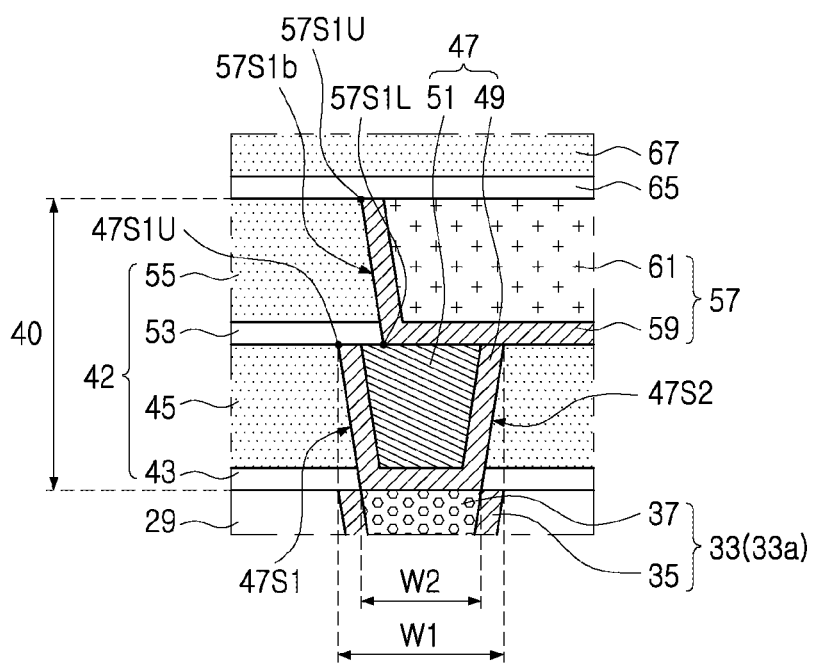
FIG. 4B is a partially enlarged view illustrating a modified example of a semiconductor device according to an example embodiment of the inventive concept.

In an example, as illustrated in FIG. 3A, an upper end 57S1U of the first end surface 57S1 of the first wiring 57 may be aligned with an upper end 47S1U of the first side surface 47S1 of the first via 47, but example embodiments thereof are not limited thereto. For example, the position of the upper end 57S1U of the first end surface 57S1 of the first wiring 57 may be modified based on a process margin or the like. As described above, modified examples of the position of the upper end 57S1U of the first end surface 57S1 of the first wiring 57 will be described with reference to FIGS. 4A and 4B, respectively. FIGS. 4A and 4B are partially enlarged views illustrating various modified examples of portion indicated by "A" of FIG. 2. In this case, reference numeral '57S1a' of FIG. 4A and reference numeral '57S1b' of FIG. 4B may represent modifications of the first end surface 57S1 of FIG. 3A.

In a modified example, referring to FIG. 4A, an upper end 57S1U of a first end surface 57S1a of the first wiring 57 may not overlap the top surface of the first via 47 in a direction parallel to a direction in which the lower structure 3, first structure 40, second structure 62, and third structure 103 are stacked. For example, the upper end 57S1U of the first end surface 57S1a of the first wiring 57 may protrude outward from the first side surface 47S1 of the first via 47. The first end surface 57S1a of the first wiring 57 and the first side surface 47S1 of the first via 47 may be aligned.

In a modified example, referring to FIG. 4B, an upper end 57S1U of a first end surface 57S1b of the first wiring 57 may overlap the top surface of the first via 47 in a direction parallel to a direction in which the lower structure 3, first structure 40, second structure 62, and third structure 103 are stacked. In an example, a distance between a lower end 57S1L of the first end surface 57S1b of the first wiring 57 and the upper end 47S1U of the first side surface 47S1 of the first via 47 may be equal to or less than ⅓ of a width W1 of a top surface of the first via 47 in the cross-sectional view of FIG. 4B.

Figure 4C:
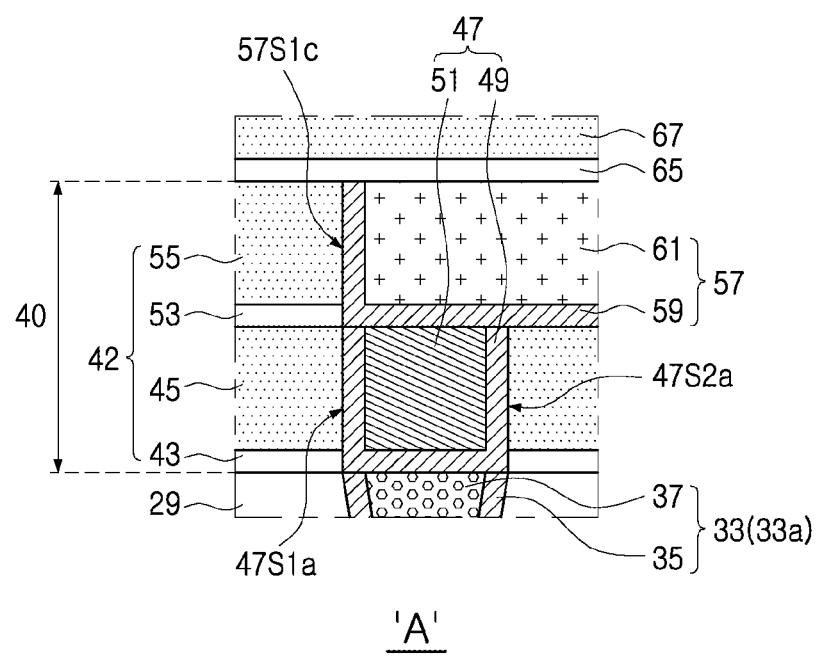
FIG. 4C is a partially enlarged view illustrating a modified example of a semiconductor device according to an example embodiment of the inventive concept.

Next, with reference to FIG. 4C, the modification of the side surface of the first wiring 57 and the side surface of the first via 47 will be described. FIG. 4C is an enlarged view illustrating a modified example of the portion indicated by "A" in FIG. 2.

Referring to FIG. 4C, the first via 47 may have a vertical side surface, and the first wiring 57 may have a vertical side surface. In this case, "vertical" may indicate that a top surface and a side surface of the first via 47 are perpendicular to each other, or a top surface and a side surface of the first wiring 57 are perpendicular to each other.

The first wiring 57 may have a first end surface 57S1c that may correspond to the first end surface (57S1 of FIG. 3A) described above with reference to FIG. 3A, and the first via 47 may have a first side surface 47S1a and a second side surface 47S2a that may correspond to the first side surface (47S1 of FIG. 3A) and the second side surface (47S2 of FIG. 3A), respectively, described above with reference to FIG. 3A. As such, the first end surface 57S1c of the first wiring 57 and the first side surface 47S1a of the first via 47 may be vertically aligned.

Figure 5:
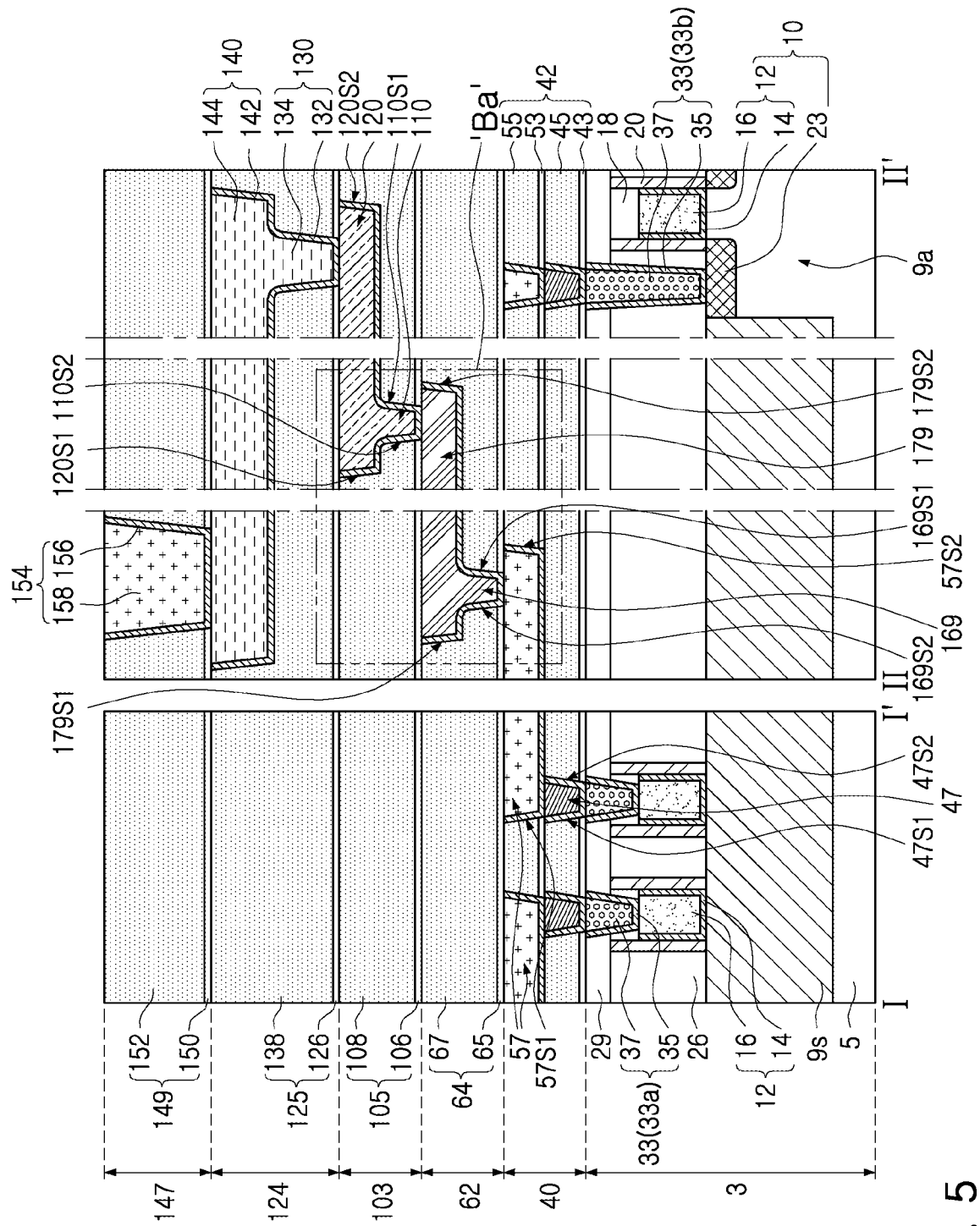
FIG. 5 is a cross-sectional view illustrating a modified example of a semiconductor device according to an example embodiment of the inventive concept.
Figure 6:
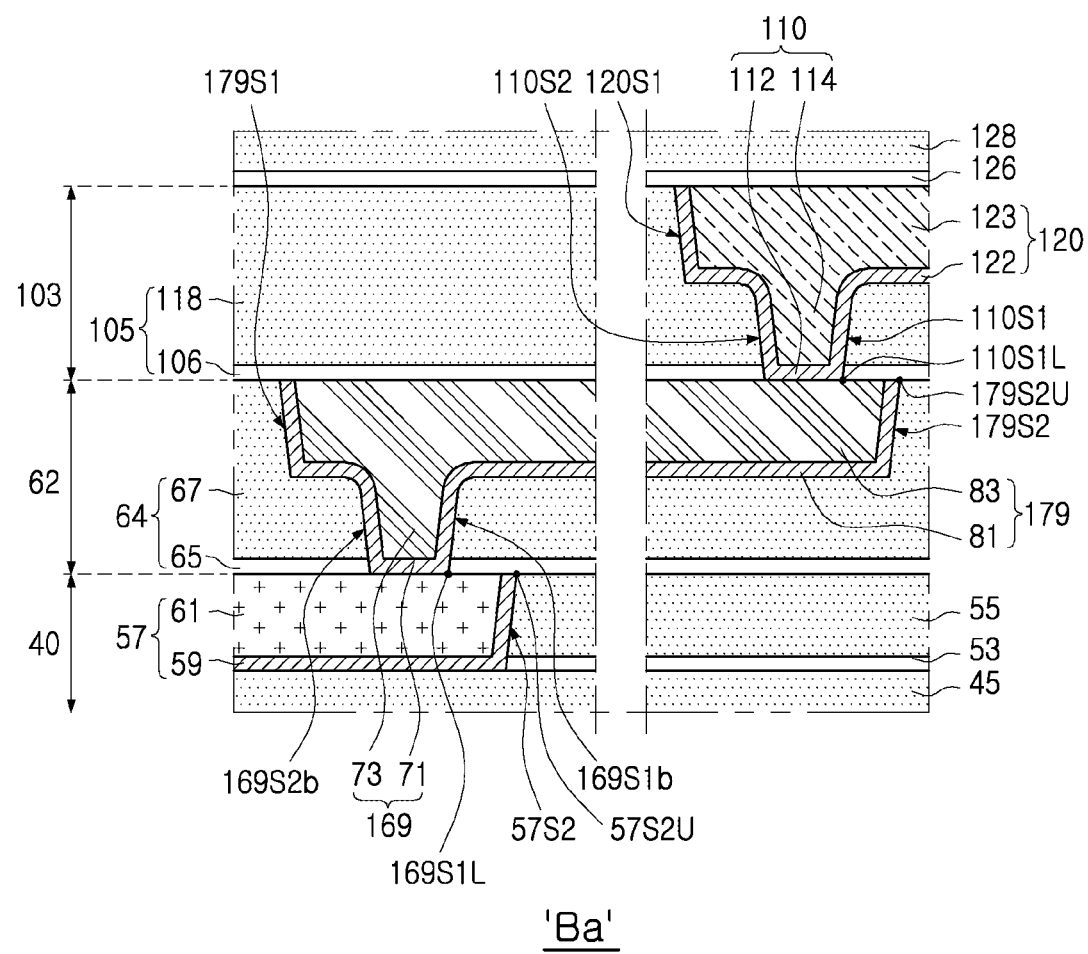
FIG. 6 is a partially enlarged view illustrating a modified example of a semiconductor device according to an example embodiment of the inventive concept.

Next, a modification of the semiconductor device according to an example embodiment of the inventive concept will be described with reference to FIGS. 5 and 6. FIG. 5 is a cross-sectional view illustrating a modified example of the semiconductor device according to an example embodiment of the inventive concept, and FIG. 6 is an enlarged view of portion "Ba" of FIG. 5. FIGS. 5 and 6 are views illustrating a modified example of the second via 69 and the second wiring 79 of FIGS. 2 and 3B. Hereinafter, the second via 69 and the second wiring 79 will be described based on modified portions thereof.

Referring to FIGS. 5 and 6 in a modified example, a second via 169 and a second wiring 179 having structures substantially the same as those of the second via (69 of FIG. 3B) and the second wiring (79 of FIG. 3B) described above may be disposed.

The second wiring 179 may have a third end surface 179S1 and a fourth end surface 179S2, similar to the second wiring 79 in FIG. 3B, and the second via 169 may have a third side surface 169S1b and a fourth side surface 169S2b, similar to the second via 69 in FIG. 3B.

The second wiring 179 may have a length greater than a length of the first wiring 57, and a distance between an upper end 57S2U of the second end surface 57S2 of the first wiring 57 and a lower end 169S1L of the third side surface 169S1b of the second via 169 may be greater than ½ of a width of the lower surface of the second via 169 in the cross-sectional views of FIGS. 5 and 6.

Figure 7:
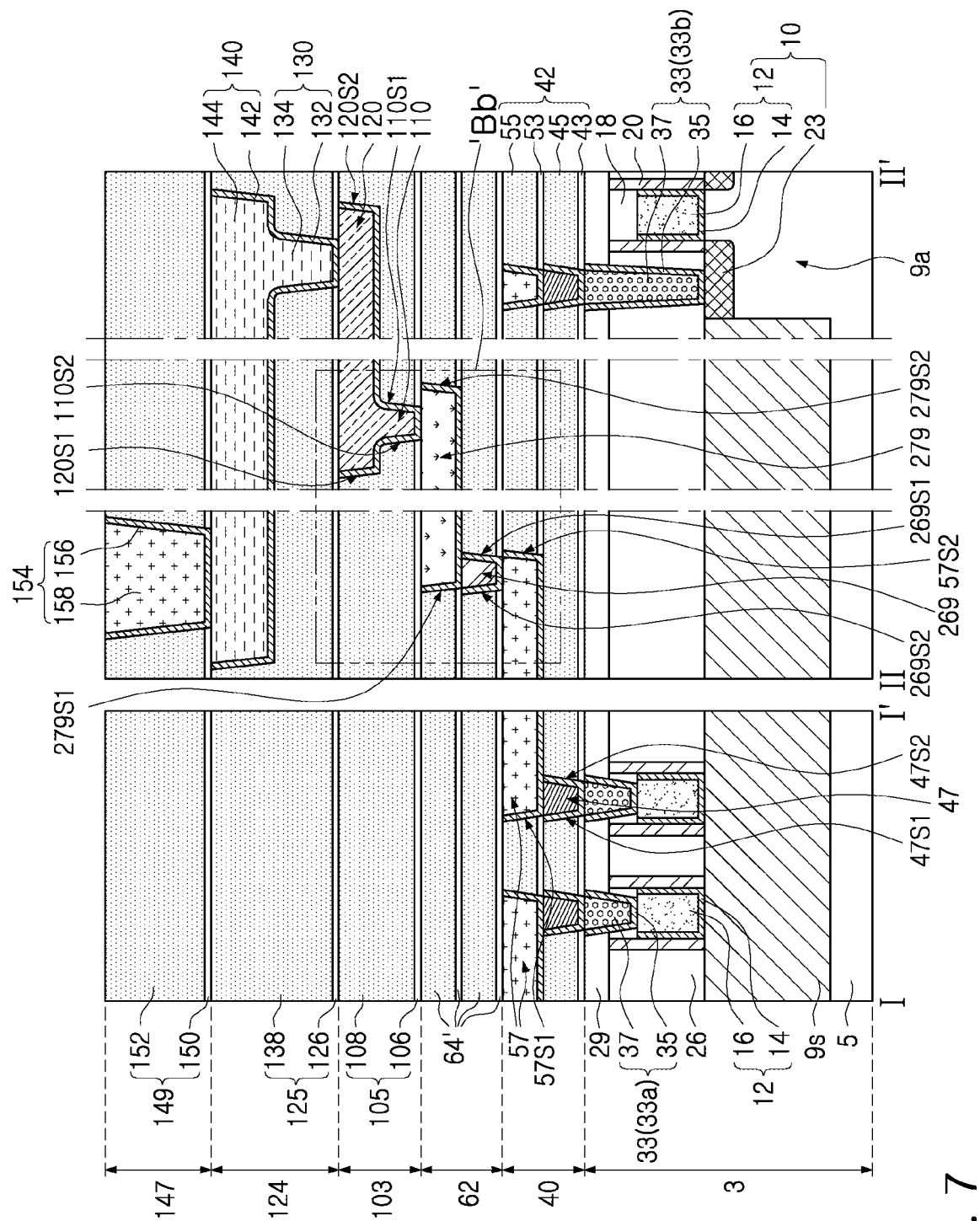
FIG. 7 is a cross-sectional view illustrating a modified example of a semiconductor device according to an example embodiment.
Figure 8:
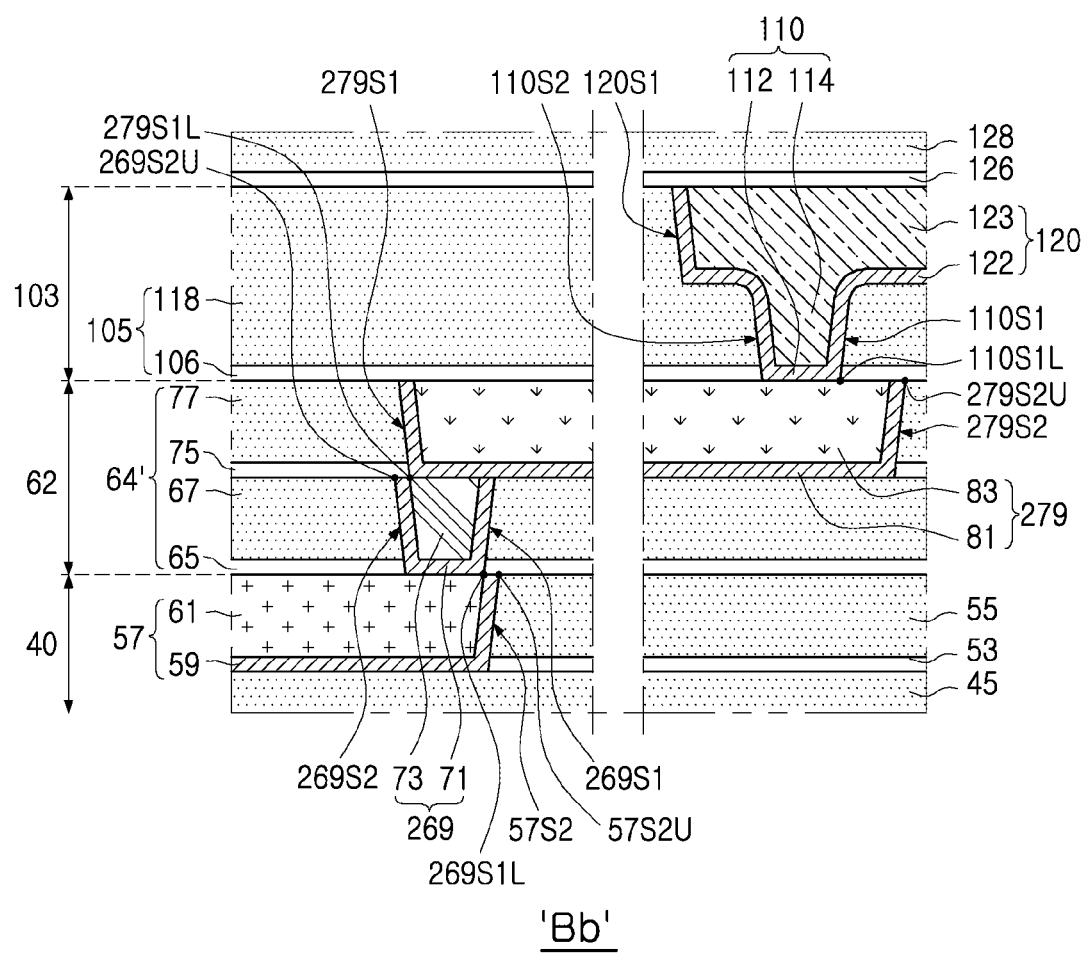
FIG. 8 is a partially enlarged view illustrating a modified example of a semiconductor device according to an example embodiment.

Next, a modified example of the semiconductor device according to an example embodiment of the inventive concept will be described with reference to FIGS. 7 and 8. FIG. 7 is a cross-sectional view illustrating a modified example of a semiconductor device according to an example embodiment of the inventive concept, and FIG. 8 is an enlarged view illustrating a portion "Bb" in FIG. 7. FIGS. 7 and 8 illustrate a modified example of the second structure 62 described with reference to FIGS. 2 and 3B.

In a modified example with reference to FIGS. 7 and 8, a second structure 62 includes a second via 269, a second wiring 279 electrically connected to the second via 269, and a second insulating structure 64' bordering or surrounding side surfaces of the second via 269 and the second wiring 279.

The second via 269 may include a second via gapfill pattern 73 and a second via barrier layer 71 on and at least partially covering side and bottom surfaces of the second via gapfill pattern 73.

The second wiring 279 may include a second wiring gapfill pattern 83 and a second wiring barrier layer 81 on and at least partially covering side and bottom surfaces of the second wiring gapfill pattern 83.

The second insulating structure 64' may include a second lower etch-stop layer 65, a second lower insulating layer 67 on the second lower etch-stop layer 65, a second upper etch-stop layer 75 on the second lower insulating layer 67, and a second upper insulating layer 77 on the second upper etch-stop layer 75.

The second lower etch-stop layer 65 and the second lower insulating layer 67 may border or surround a side surface of the second via 269. The second upper etch-stop layer 75 and the second upper insulating layer 77 may border or surround a side surface of the second wiring 279.

The second wiring 279 may have a third end surface 279S1 and a fourth end surface 279S2 opposing each other, and the second via 269 may have a third side surface 269S1 adjacent to the second end surface 57S2 of the first wiring 57, and a fourth side surface 269S2 adjacent to the third end surface 279S1 of the second wiring 279.

In an example, the second via 269 may have a square shape or may have a shape in which corners of a square are rounded.

In an example, a length of the second wiring 279 may be 50 times or less than a width of the second via 269 in the cross-sectional views of FIGS. 7 and 8. The length of the second wiring 279 may be a length obtained by measuring a distance between the third end surface 279S1 and the fourth end surface 279S2. The length of the second wiring 279 may be a length measured based on substantially the same reference as that of the length of the first wiring 57 described above. The width of the second via 269 may be a width measured based on substantially the same reference as that of the width of the first via 47 described above.

A length of a top surface of the second wiring 279 may be about 50 times or less than a width of a top surface of the second via 269, and a length of a top surface of the first wiring 57 may be about 50 times or less than a width of a top surface of the second via 269 in the cross-sectional views of FIGS. 7 and 8.

In an example, similar to the first and second side surfaces 47S1 and 47S2 of the first via 47 (see FIG. 3A), the third and fourth side surfaces 269S1 and 269S2 of the second via 269 may be inclined. Similar to the first and second end surfaces 57S1 and 57S2 of the first wiring 57 (see FIG. 3A), the third and fourth end surfaces 279S1 and 279S2 of the second wiring 279 may be inclined.

In an example, the third side surface 269S1 of the second via 269 and the second end surface 57S2 of the first wiring 57 may overlap in a vertical direction, i.e., in a direction parallel to a direction in which the lower structure 3, first structure 40, second structure 62, and third structure 103 are stacked.

In an example, the fourth side surface 269S2 of the second via 269 and the third end surface 279S1 of the second wiring 279 may overlap each other in the vertical direction, i.e., in a direction parallel to a direction in which the lower structure 3, first structure 40, second structure 62, and third structure 103 are stacked.

In an example, the distance between the lower end 269S1L of the third side surface 269S1 of the second via 269 and the upper end 57S1U of the second end surface 57S2 of the first wiring 57 may be about ⅓ or less of the width of the top surface of the second via 269, or may be "0" in the cross-sectional views of FIGS. 7 and 8.

In an example, the distance between the upper end 269SU of the fourth side surface 269S2 of the second via 269 and the lower end 279S1L of the third end surface 279S1 of the second wiring 279 may be about ⅓ or less of a width of the top surface of the second via 269, or may be "0" in the cross-sectional views of FIGS. 7 and 8.

The distance between the lower end 269S1L of the third side surface 269S1 of the second via 269 and the upper end 57S1U of the second end surface 57S2 of the first wiring 57 may be less than a distance between an upper end 279S2U of the fourth end surface 279S2 of the second wiring 279 and a lower end 110S1L of the fifth side surface 110S1 of the third via 110 in the cross-sectional views of FIGS. 7 and 8.

In an example, the distance between the upper end 269SU of the fourth side surface 269S2 of the second via 269 and the lower end 279S1L of the third end surface 279S1 of the second wiring 279 may be less than the distance between an upper end 279S2U of the fourth end surface 279S2 of the second wiring 279 and a lower end 110S1L of the fifth side surface 110S1 of the third via 110 in the cross-sectional views of FIGS. 7 and 8.

Figure 9:
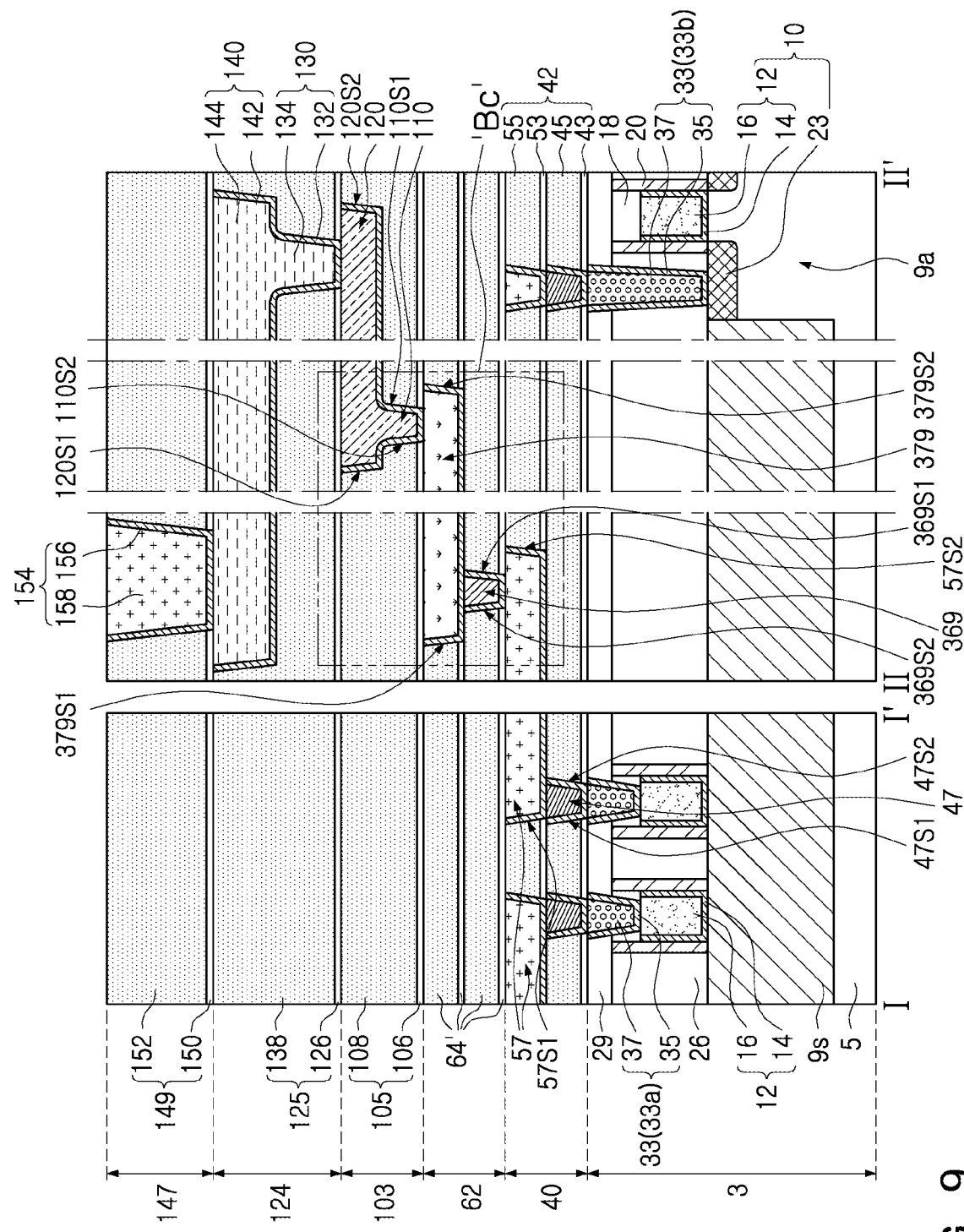
FIG. 9 is a cross-sectional view illustrating a modified example of a semiconductor device according to an example embodiment.
Figure 10:
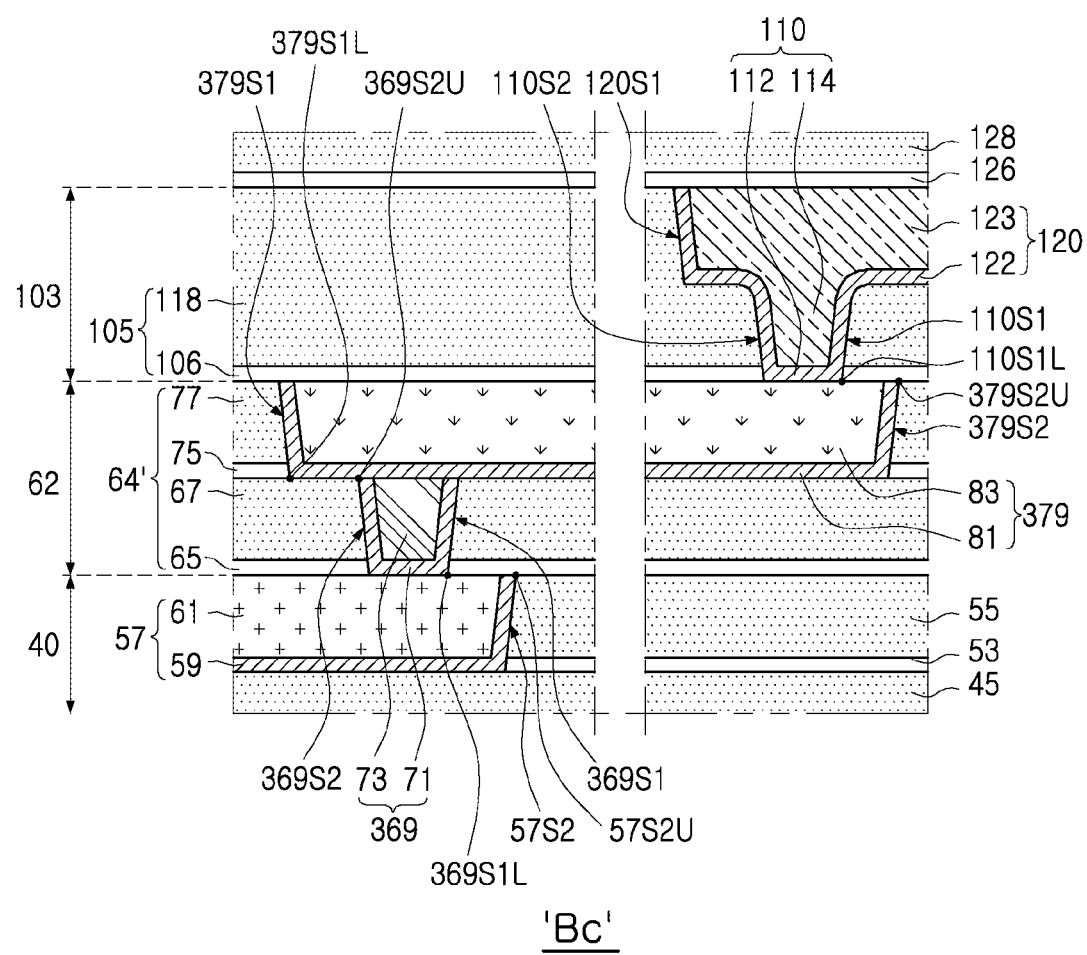
FIG. 10 is a partially enlarged view illustrating a modified example of a semiconductor device according to an example embodiment.

A modification of the semiconductor device according to an example embodiment of the inventive concept will be described with reference to FIGS. 9 and 10. FIG. 9 is a cross-sectional view illustrating a modified example of a semiconductor device according to an example embodiment of the inventive concept, and FIG. 10 is an enlarged view illustrating a portion 'Bc' of FIG. 9. FIGS. 9 and 10 illustrate a modification of the second structure 62 described with reference to FIGS. 2 and 3B.

Referring to FIGS. 9 and 10 in a modified example, the second structure 62 includes a second via 369, a second wiring 379 electrically connected to the second via 369, and a second insulating structure 64' bordering or surrounding side surfaces of the second via 369 and the second wiring 379.

The second via 369 may include a second via gapfill pattern 73 and a second via barrier layer 71 on or at least partially covering side and bottom surfaces of the second via gapfill pattern 73. The second wiring 379 may include a second wiring gapfill pattern 83 and a second wiring barrier layer 81 on or at least partially covering side and bottom surfaces of the second wiring gapfill pattern 83. The second insulating structure 64' may include a second lower etch-stop layer 65, a second lower insulating layer 67 on the second lower etch-stop layer 65, a second upper etch-stop layer 75 on the second lower insulating layer 67, and a second upper insulating layer 77 on the second upper etch-stop layer 75.

The second lower etch-stop layer 65 and the second lower insulating layer 67 may border or surround a side surface of the second via 369. The second upper etch-stop layer 75 and the second upper insulating layer 77 may border or surround a side surface of the second wiring 379.

The second wiring 379 may have a third end surface 379S1 and a fourth end surface 379S2 opposing each other, and the second via 369 may have a third side surface 369S1 adjacent to the second end surface 57S1 of the first wiring 57, and a fourth side surface 369S2 adjacent to the third end surface 379S1 of the second wiring 379.

In an example, the length of the second wiring 379 may be greater than about 50 times the width of the second via 369 in the cross-sectional views of FIGS. 9 and 10. The length of the second wiring 379 may be a length provided by measuring a distance between the third end surface 379S1 and the fourth end surface 379S2. The length of the second wiring 379 may be a length measured based on substantially the same reference as that of the length of the first wiring 57 described above. The width of the second via 369 may be a width measured based on substantially the same reference as that of the width of the first via 47 described above.

In an example, the length of the second wiring 379 may be greater than the length of the first wiring 57 in the cross-sectional views of FIGS. 9 and 10.

In an example, similar to the first and second side surfaces 47S1 and 47S2 of the first via 47 (see FIG. 3A), the third and fourth side surfaces 369S1 and 369S2 of the second via 369 may be inclined. Similar to the first and second end surfaces 57S1 and 57S2 of the first wiring 57 (see FIG. 3A), the third and fourth end surfaces 379S1 and 379S2 of the second wiring 379 may be inclined.

The distance between the lower end 369S1L of the third side surface 369S1 of the second via 369 and the upper end 57S1U of the second end surface 57S2 of the first wiring 57 may be greater than about ½ of the width of the top surface of the second via 369 in the cross-sectional views of FIGS. 9 and 10. The distance between the lower end 369S1L of the third side surface 369S1 of the second via 369 and the upper end 57S1U of the second end surface 57S2 of the first wiring 57 may be greater than about ⅓ of the width of the top surface of the second via 369 in the cross-sectional views of FIGS. 9 and 10.

The distance between the upper end 369SU of the fourth side surface 369S2 of the second via 369 and the lower end 379S1L of the third end surface 379S1 of the second wiring 379 may be greater than about ½ of the width of the top surface of the second via 369 in the cross-sectional views of FIGS. 9 and 10.

The distance between the upper end 369SU of the fourth side surface 369S2 of the second via 369 and the lower end 379S1L of the third end surface 379S1 of the second wiring 379 may be greater than about ⅓ of the width of the top surface of the second via 369 in the cross-sectional views of FIGS. 9 and 10.

In an example embodiment, the distance between the lower end 369S1L of the third side surface 369S1 of the second via 369 and the upper end 57S1U of the second end surface 57S2 of the first wiring 57 and the distance between the upper end 369SU of the fourth side surface 369S2 of the second via 369 and the lower end 379S1L of the third end surface 379S1 of the second wiring 379 may each be greater than the distance between the upper end 47S1U of the first side surface 47S1 of the first via 47 and the lower end 57S1L of the first end surface 57S1 of the first wiring 57 in the cross-sectional views of FIGS. 9 and 10. Therefore, a defect by electromigration may be mitigated or prevented. For example, the distance between the lower end 369S1L of the third side surface 369S1 of the second via 369 and the upper end 57S1U of the second end surface 57S2 of the first wiring 57 and the distance between the upper end 369SU of the fourth side surface 369S2 of the second via 369 and the lower end 379S1L of the third end surface 379S1 of the second wiring 379 may be formed to be greater than about ⅓ of the width of the top surface of the second via 369 in the cross-sectional views of FIGS. 9 and 10. Therefore, voids that may occur due to electromigration may be formed at an end portion of the second wiring 379 adjacent to the third end surface 379S1 and may be spaced apart from the second via 369. Thus, a defect such as a disconnection between the second via 369 and the second wiring 379, may be less likely or may not occur.

Next, an example of a method of forming a semiconductor device according to an example embodiment of the inventive concept will be described with reference to FIGS. 11 to 13.

Figure 11:
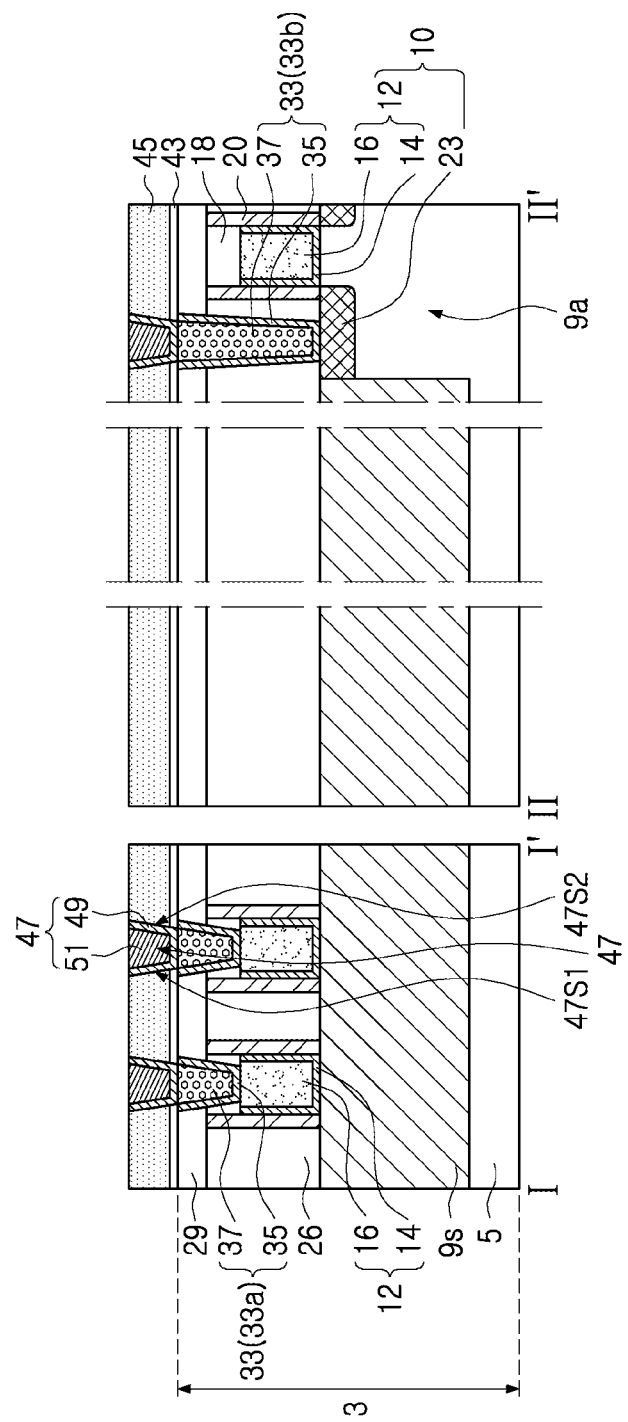
FIGS. 11 to 13 are cross-sectional views illustrating an example of a method of forming a semiconductor device according to an example embodiment.

Referring to FIGS. 1 and 11, the first lower etch-stop layer 43 and the first lower insulating layer 45 may be sequentially formed on the lower structure 3. Forming the lower structure 3 may include forming an isolation region 9s defining an active region 9a on the semiconductor substrate 5, forming a transistor 10, forming interlayer insulating layers 26 and 29, and forming contact plugs 33 electrically connected to conductive regions 16 and 23 of the transistor 10. In this case, the conductive region of the transistor 10 may be the gate electrode 16 and the source/drain region 23. A process of forming the transistor 10 may include forming a gate structure (12, 18, 20) overlapping the active region 9a in a vertical direction in the cross-sectional view of FIG. 11 and extending onto the isolation region 9s and forming the source/drain region 23 disposed in the active region 9a next to the gate structure (12, 18, 20). The gate structure (12, 18, 20) may include a gate 12 and an insulating capping layer 18 stacked sequentially, and an insulating spacer 20 on sides of the gate 12 and the insulating capping layer 18. The gate 12 may include the gate electrode 16 and the gate dielectric 14 on and at least partially covering side and bottom surfaces of the gate electrode 16.

The interlayer insulating layers (26 and 29) may include a first interlayer insulating layer 26 on the isolation region 9s and the active region 9a, and a second interlayer insulating layer 29 on the first interlayer insulating layer 26. The second interlayer insulating layer 29 may be on and at least partially cover an upper portion of the insulating capping layer 18. Each of the contact plugs 33 may include a plug pattern 37 and a barrier layer 35 on and at least partially covering side and bottom surfaces of the plug pattern 37.

A first via 47 may be formed to penetrate through the first lower etch-stop layer 43 and the first lower insulating layer 45 and to be electrically connected to the contact plugs 33. Forming the first via 47 may include forming a hole penetrating through the first lower etch-stop layer 43 and the first lower insulating layer 45, forming a first via barrier layer 49 on and at least partially covering a sidewall and a bottom of the hole and on and at least partially covering the first lower insulating layer 45, forming a first via gapfill pattern 51 on and at least partially covering the first via barrier layer 49 and at least partially filling the remaining portion of the hole, and planarizing the first via gapfill pattern 51 and the first via barrier layer 49 until the top surface of the first lower insulating layer 45 is exposed. Thus, the first via 47 having a single damascene structure may be formed.

Figure 12:
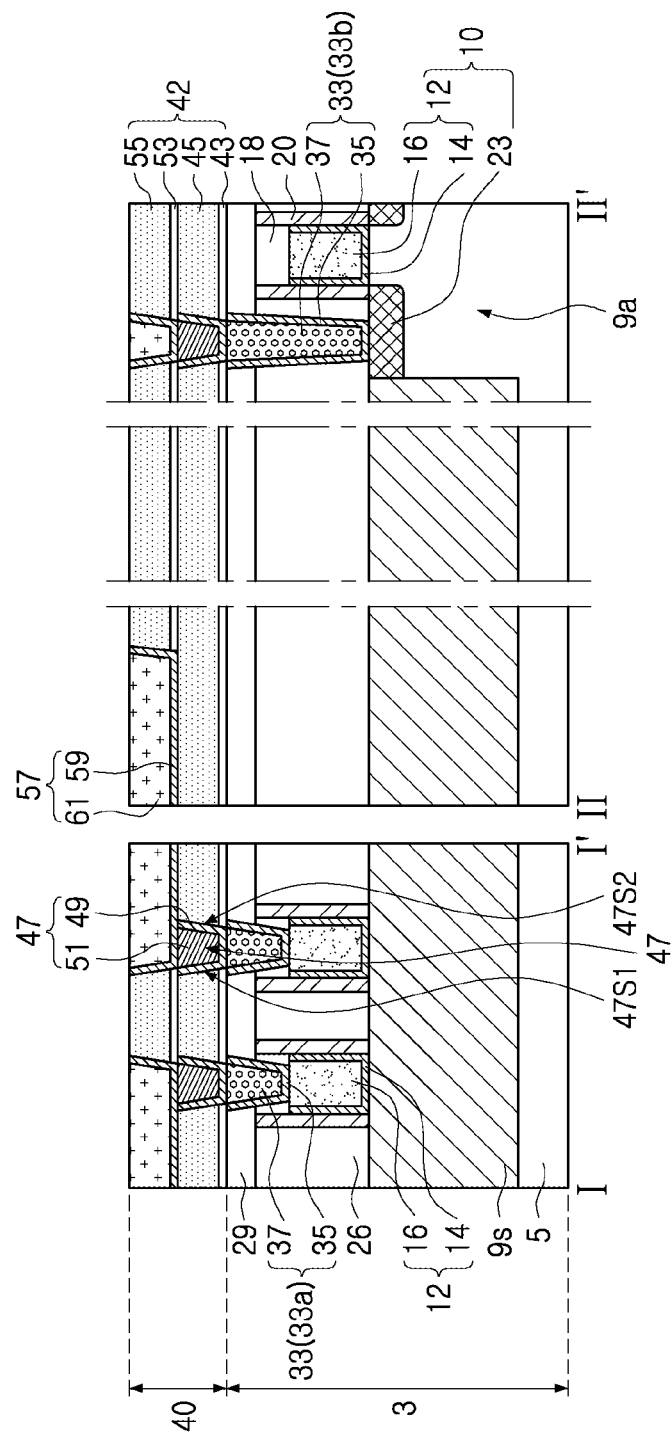

Referring to FIGS. 1 and 12, a first upper etch-stop layer 53 and a first upper insulating layer 55 may be sequentially formed on the first lower insulating layer 45. The first lower etch-stop layer 43, the first lower insulating layer 45, the first upper etch-stop layer 53, and the first upper insulating layer 55 may constitute a first insulating structure 42.

A first wiring 57 may be formed to penetrate through the first upper etch-stop layer 53 and the first upper insulating layer 55 and to be electrically connected to the first via 47. Forming the first wiring 57 may include forming a trench that penetrates through the first upper etch-stop layer 53 and the first upper insulating layer 55, forming a first wiring barrier layer 59 on and at least partially covering a sidewall and a bottom of the trench and on and at least partially covering the first upper insulating layer 55, forming a first wiring gapfill pattern 61 on and at least partially covering the first wiring barrier layer 59 and at least partially filling the remaining portion of the trench, and planarizing the first wiring gapfill pattern 61 and the first wiring barrier layer 59 until the top surface of the first upper insulating layer 55 is exposed. Therefore, the first wiring 57 of the single damascene structure may be formed. Accordingly, the first via 47 and the first wiring 57, which are the same as those described with reference to FIGS. 1, 2, 3A and 3B, may be formed. The first via 47, the first wiring 57, and the first insulating structure 42 may constitute the first structure 40 as that described with reference to FIGS. 1, 2, 3A and 3B.

Figure 13:
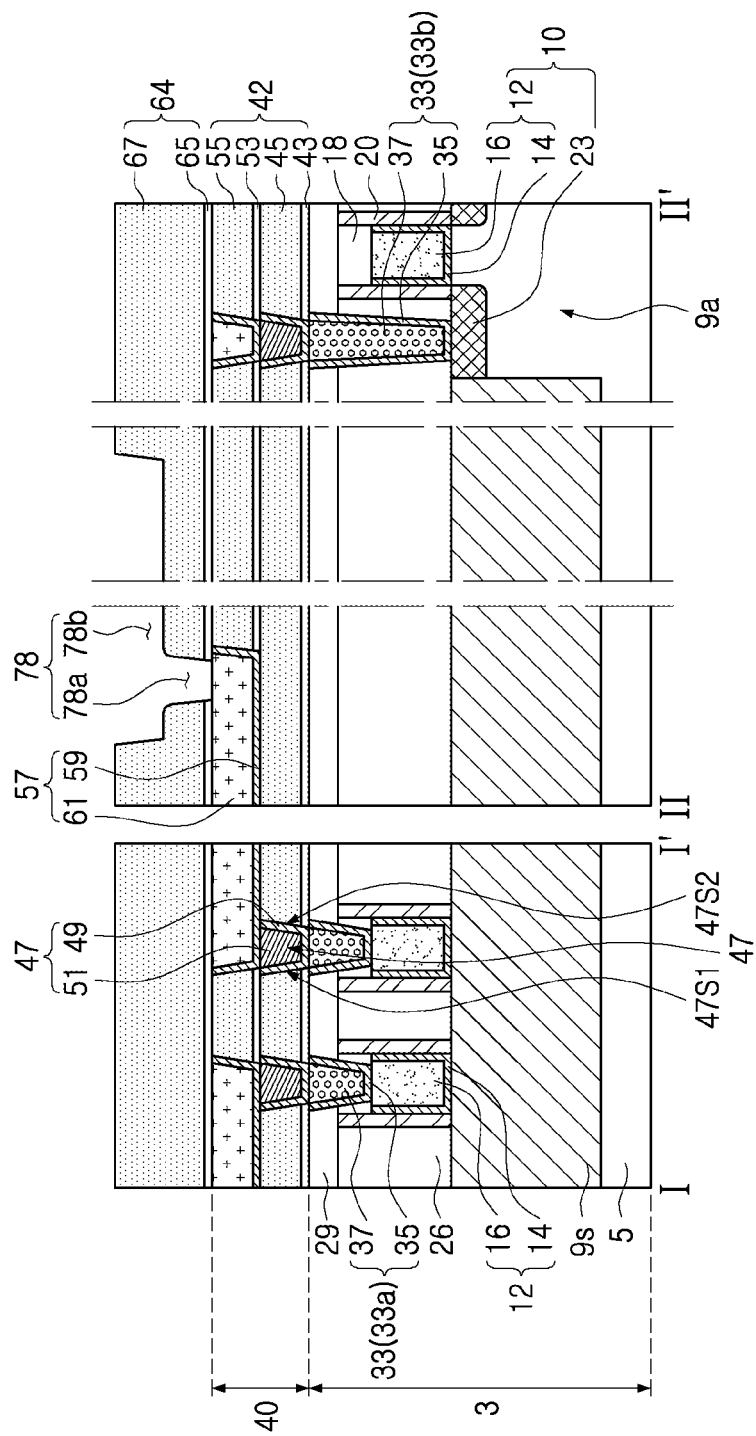

Referring to FIGS. 1 and 13, a second insulating structure 64 may be formed on the first structure 40. The second insulating structure 64 may include a second lower etch-stop layer 65 and a second lower insulating layer 67 that are sequentially stacked. The second insulating structure 64 may be patterned to form a dual damascene opening 78. The dual damascene opening 78 may include a via hole 78a exposing a portion of the first wiring 57 and a trench 78b overlapping the via hole 78a in a vertical direction in the cross-sectional view of FIG. 13.

Referring again to FIGS. 1, 2, 3A and 3B, a second via 69 and a second wiring 79 at least partially filling the dual damascene opening 78 (see FIG. 12) may be formed. Forming the second via 69 and the second wiring 79 may include forming barrier layers 71 and 81 on and at least partially covering a sidewall and a bottom of the dual damascene opening 78 (see FIG. 12) and on and at least partially covering the second lower insulating layer 67, forming gapfill patterns 73 and 83 on and at least partially covering the barrier layers 71 and 81 and at least partially filling the remaining portion of the dual damascene opening 78 (FIG. 12), and planarizing the gapfill patterns 73 and 83 and the barrier layers 71 and 81 until the top surface of the second lower insulating layer 67 is exposed. Thus, the second via 69 in the via hole (78a of FIG. 12) of the dual damascene opening (78 of FIG. 12), and the second wiring 79 in the trench (78b of FIG. 12) of the dual damascene opening (78 of FIG. 12) may be formed. Accordingly, the second via 69 and the second wiring 79 may be formed by a dual damascene structure.

The second insulating structure 64, the second via 69, and the second wiring 79 may form a second structure 62. The third structure 103 and the fourth structure 124 described above may be formed using a similar method of forming the second structure 62, for example, a process of forming a dual damascene structure. The fifth structures 147 may be formed using a process of forming a single damascene structure.

As set forth above, according to example embodiments of the inventive concept, a semiconductor device having an improved degree of integration may be provided. According to example embodiments of the inventive concept, a semiconductor device having a via and wiring, in which reliability may be improved, may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a lower structure;
a first structure on the lower structure;
a second structure on the first structure; and
an upper insulating structure on the second structure,
wherein the lower structure includes a conductive region, a lower insulating structure on the conductive region, and a contact plug penetrating through the lower insulating structure and contacting the conductive region,
wherein the first structure includes a first insulating structure, and a via penetrating through the first insulating structure and contacting the contact plug,
wherein the second structure includes a second insulating structure, and a wiring penetrating through the second insulating structure and contacting the via and the first insulating structure,
wherein sides of the via include a first via side surface and a second via side surface opposing each other,
wherein sides of the wiring include a first wiring side surface vertically overlapping the via and a second wiring side surface vertically overlapping the first insulating structure,
wherein an upper surface of the via includes a first surface contacting the second insulating structure and a second surface contacting the wiring,
wherein the first via side surface of the via vertically overlaps the second insulating structure,
wherein the second via side surface of the via vertically overlaps the wiring,
wherein the first insulating structure includes a first etch stop layer and a first insulating layer on the first etch stop layer,
wherein the second insulating structure includes a second etch stop layer and a second insulating layer on the second etch stop layer,
wherein the second etch stop layer contacts an upper surface of the first insulating layer and the first surface of the upper surface of the via,
wherein the upper insulating structure includes an upper etch stop layer and an upper insulating layer on the upper etch stop layer, and
wherein the upper etch stop layer contacts an upper surface of the second insulating layer and an upper surface of the wiring.

2. The semiconductor device of claim 1, wherein a distance between an upper end of the first via side surface and a lower end of the first wiring side surface is not greater than ⅓ of a width of the upper surface of the via.

3. The semiconductor device of claim 1, wherein the via includes a via gapfill pattern and a via barrier layer on side and bottom surfaces of the via gapfill pattern,
wherein the wiring includes a wiring gapfill pattern and a wiring barrier layer on side and bottom surfaces of the wiring gapfill pattern, and
wherein the wiring barrier layer includes a portion interposed between the wiring gapfill pattern and the via gapfill pattern.

4. The semiconductor device of claim 3, wherein the second etch stop layer contacts a portion of the via barrier layer and a portion of the via gapfill pattern.

5. The semiconductor device of claim 1, wherein the lower insulating structure includes an insulating capping layer and a lower insulating layer on the insulating capping layer, and
wherein the contact plug penetrates through the lower insulating layer and the insulating capping layer.

6. The semiconductor device of claim 1, wherein a width of the upper surface of the via is greater than a width of a lower surface of the via.

7. The semiconductor device of claim 1, wherein a distance between a lower surface of the contact plug and an upper surface of the contact plug is greater than a distance between a lower surface of the via and the upper surface of via.

8. The semiconductor device of claim 1, wherein a thickness of the first insulating layer is greater than a thickness of the first etch stop layer,
   wherein a thickness of the second insulating layer is greater than a thickness of the second etch stop layer, and
   wherein a thickness of the upper insulating layer is greater than a thickness of the upper etch stop layer.

9. The semiconductor device of claim 1, wherein a material of the first insulating layer is different from a material of the first etch stop layer,
   wherein a material of the second insulating layer is different from a material of the second etch stop layer, and
   wherein a material of the upper insulating layer is different from a material of the upper etch stop layer.

10. A semiconductor device comprising:
   a substrate;
   a first insulating structure on the substrate;
   a via penetrating the first insulating structure;
   a second insulating structure on the via and the first insulating structure;
   a wiring penetrating through the second insulating structure and contacting the first insulating structure and the via; and
   an upper insulating structure on the second insulating structure and the wiring,
   wherein sides of the via include a first via side surface and a second via side surface opposing each other,
   wherein sides of the wiring include a first wiring side surface vertically overlapping the via and a second wiring side surface vertically overlapping the first insulating structure,
   wherein an upper surface of the via includes a first surface contacting the second insulating structure and a second surface contacting the wiring,
   wherein the first via side surface of the via vertically overlaps the second insulating structure,
   wherein the second via side surface of the via vertically overlaps the wiring,
   wherein a lower surface of the wiring is formed with an obtuse angle relative to the first wiring side surface of the wiring, and
   wherein the first surface of the upper surface of the via includes a first portion vertically overlapping the wiring and a second portion not vertically overlapping the wiring.

11. The semiconductor device of claim 10, wherein a lower surface of the via is formed with an obtuse angle relative to the first via side surface of the via.

12. The semiconductor device of claim 10, wherein a first distance between an upper end of the first via side surface and a lower end of the wiring side surface is not greater than ⅓ of a width of the upper surface of the via.

13. The semiconductor device of claim 10, wherein the second insulating structure includes an etch stop layer and an insulating layer on the etch stop layer,
   wherein a thickness of the insulating layer is greater than a thickness of the etch stop layer, and
   wherein a material of the insulating layer is different from a material of the etch stop layer.

14. The semiconductor device of claim 13, wherein the etch stop layer contacts an upper surface of the first insulating structure and the first surface of the upper surface of the via.

15. The semiconductor device of claim 13, wherein the via includes a via gapfill pattern and a via barrier layer contacting side surfaces of the via gapfill pattern, and
   wherein the etch stop layer contacts a portion of the via barrier layer and a portion of the via gap fill pattern.

16. The semiconductor device of claim 10, wherein a width of the upper surface of the via is greater than a width of a lower surface of the via.

17. A semiconductor device comprising:
   a lower structure;
   a first structure on the lower structure;
   a second structure on the first structure; and
   an upper insulating structure on the second structure,
   wherein the lower structure includes a first conductive region, a lower insulating structure on the first conductive region, and a contact plug penetrating through the lower insulating structure and contacting the first conductive region,
   wherein the first structure includes a first insulating structure, and a via penetrating through the first insulating structure and contacting the contact plug,
   wherein the second structure includes a second insulating structure, and a wiring penetrating through the second insulating structure and contacting the via and the first insulating structure,
   wherein sides of the via include a first via side surface and a second via side surface opposing each other,
   wherein sides of the wiring include a first wiring side surface vertically overlapping the via and a second wiring side surface vertically overlapping the first insulating structure,
   wherein an upper surface of the via includes a first surface contacting the second insulating structure and a second surface contacting the wiring,
   wherein the first via side surface of the via vertically overlaps the second insulating structure,
   wherein the second via side surface of the via vertically overlaps the wiring,
   wherein the lower insulating structure includes a lower capping layer and a lower insulating layer on the lower capping layer,
   wherein the first insulating structure includes a first etch stop layer and a first insulating layer on the first etch stop layer,
   wherein the second insulating structure includes a second etch stop layer and a second insulating layer on the second etch stop layer,
   wherein the second etch stop layer contacts an upper surface of the first insulating layer and the first surface of the upper surface of the via,
   wherein the upper insulating structure includes an upper etch stop layer and an upper insulating layer on the upper etch stop layer,
   wherein the upper etch stop layer contacts an upper surface of the second insulating layer and an upper surface of the wiring, and
   wherein a first thickness of the lower capping layer is greater than a second thickness of the second etch stop layer.

18. The semiconductor device of claim 17, wherein the first thickness of the lower capping layer is greater than 2 times the second thickness of the second etch stop layer.

19. The semiconductor device of claim 17, wherein the first thickness of the lower capping layer is greater than 3 times the second thickness of the second etch stop layer.

20. The semiconductor device of claim 17, wherein the lower structure further includes a second conductive region spaced apart from the first conductive region,
   wherein the contact plug penetrates through the lower insulating layer and the lower capping layer and contacts the first conductive region, and
   wherein a lower surface of the contact plug is at a different level than an upper surface of the second conductive region.

* * * * *